United States Patent [19]
MacWilliams

[11] Patent Number: 5,421,734
[45] Date of Patent: Jun. 6, 1995

[54] METHOD AND APPARATUS FOR EVOLVING BUS FROM FIVE VOLT TO THREE POINT THREE VOLT OPERATION

[75] Inventor: Peter MacWilliams, Aloha, Oreg.

[73] Assignee: Intel Corporation, Santa Clara, Calif.

[21] Appl. No.: 147,112

[22] Filed: Nov. 3, 1993

[51] Int. Cl.$^6$ .............................................. H01R 9/09
[52] U.S. Cl. ..................................... 439/59; 439/218; 439/633; 439/680
[58] Field of Search ..................... 439/59–60, 439/633, 680, 217, 218

[56] References Cited

U.S. PATENT DOCUMENTS

| | | | |
|---|---|---|---|
| 3,566,340 | 2/1971 | Jayne et al. | 439/633 |
| 3,818,280 | 6/1974 | Smith et al. | 439/633 |
| 4,368,942 | 1/1983 | Mathe et al. | 439/680 X |
| 5,277,611 | 1/1994 | Berek et al. | 439/59 |

Primary Examiner—Kenneth J. Ramsey
Attorney, Agent, or Firm—Blakely, Sokoloff, Taylor & Zafman

[57] ABSTRACT

The present invention provides an apparatus for evolving a 5 volt $V_{cc}$ signaling environment to a 3.3 volt $V_{cc}$ signaling environment. A 5 volt bus connector and a 3.3 volt bus connector are provided with a key disposed at different locations on the respective connectors. A 5 volt circuit board, populated with components compatible with 5 volt signaling environment, includes a mating key designed to receive the key of the 5 volt connector. A 3.3 volt circuit board, populated with components compatible with 3.3 volt signaling environment, includes a mating key designed to receive the key of the 3.3 volt connector. Accordingly, the 5 volt circuit board may only be inserted into the 5 volt connector, and the 3.3 volt circuit board may only be inserted into the 3.3 volt connector. A universal dual voltage board is provided which may be populated with components compatible with either 5 volt or 3.3 volt signaling environment. The universal dual voltage board includes mating keys designed to receive both the keys for the 5 and 3.3 volt circuit, and as such, may be inserted into either the 5 or 3.3 volt connector. The universal dual voltage board also includes special I/O power metal contacts which mate with the special I/O power pins in either the 5 or 3.3 volt connector so that the universal dual voltage can be adapted to the signaling environment of the connector. A method is also provided to evolve a 5 volt $V_{cc}$ bus into a 3.3 volt $V_{cc}$ bus without rendering the existing 5 volt $V_{cc}$ bus systems incompatible.

11 Claims, 4 Drawing Sheets

METHOD AND APPARATUS FOR EVOLVING BUS FROM FIVE VOLT TO THREE POINT THREE VOLT OPERATION

BACKGROUND OF THE INVENTION

1. Field of the Invention

The present invention relates to apparatus and methods for evolving a 5 volt signaling environment to a 3.3 volt signaling environment. More particularly, the present invention relates to the evolution of a bus system with connectors having circuits configured for 5 volts to a bus system which is capable of supporting both 5 volt as well as 3.3 volt circuit devices.

2. Art Background

Over the past two decades, semiconductor devices, and bus systems to which these devices are coupled, have been developed based on 5 volt ($V_{cc}$) specification and signaling technology. Most microprocessors, memories and other digital electronic components operate using a 5 volt $V_{cc}$ which has become a standard throughout the world. Personal computers, workstations and many other electronic systems utilize 5 volt $V_{cc}$ signaling and switching environments.

The development and implementation of process technology based on a $V_{cc}$ of 3.3 volts promises significant power savings in future systems. As a result of the advantages of 3.3 volt process technology and signaling environments, manufacturers are now producing semiconductor components such as central processing units (CPUs) and memory devices based on this new 3.3 volt $V_{cc}$ standard. However, the use of 3.3 volt technology presents compatibility problems for existing 5 volt $V_{cc}$ systems. Although it is likely that 5 volt systems will be phased out in the future in favor of the 3.3 volt signaling standard, it is not cost effective to immediately phase out 5 volt systems since there is a significant base of existing technology currently in use throughout the world.

As will be described, the present invention provides a method and apparatus for transition from a 5 volt to a 3.3 volt signaling environment in a bus system with connectors by allowing a connector with a key to accept an add-in board with a mating key and by providing predetermined I/O power pins in the connector so that the voltage signaling environment of the add-in board can be adapted to the voltage signaling environment of the connector.

SUMMARY OF THE INVENTION

The present invention provides an apparatus for evolving a 5 volt $V_{cc}$ signaling environment to a 3.3 volt $V_{cc}$ signaling environment. A 5 volt bus connector and a 3.3 volt bus connector are provided with a key disposed at different locations on the respective connectors. A 5 volt circuit board, populated with components compatible with 5 volt signaling environment, includes a mating key designed to receive the key of the 5 volt connector. A 3.3 volt circuit board, populated with components compatible with 3.3 volt signaling environment, includes a mating key designed to receive the key of the 3.3 volt connector. Accordingly, the 5 volt circuit board may only be inserted into the 5 volt connector, and the 3.3 volt circuit board may only be inserted into the 3.3 volt connector. A universal dual voltage board is provided which may be populated with components compatible with either 5 volt or 3.3 volt signaling environment. The universal dual voltage board includes mating keys designed to receive both the keys for the 5 and 3.3 volt circuit, and as such, may be inserted into either the 5 or 3.3 volt connector. The universal dual voltage board also includes special I/O power metal contacts which mate with the special I/O power pins in either the 5 or 3.3 volt connector so that the universal dual voltage can be adapted to the signaling environment of the connector. A method is also provided to evolve a 5 volt $V_{cc}$ bus into a 3.3 volt $V_{cc}$ bus without rendering the existing 5 volt $V_{cc}$ bus systems incompatible.

DETAILED DESCRIPTION OF THE INVENTION

The present invention provides a method and apparatus for the evolution of 5 volt $V_{cc}$ signaling environment to a 3.3 volt $V_{cc}$ signaling environment on a bus. In the following description, numerous details are set forth such as board configurations, voltages and the like in order to provide a thorough understanding of the present invention. However, it will be apparent to one skilled in the art that the present invention may be practiced without these specific details.

Bus architecture, for a mother board or other electronic components, defines the signaling environment for the bus. For example, traditional signaling environments have been 5 volt $V_{cc}$ with supporting process technology designed to operate only in a 5 volt signaling environment. Similarly, modern 3.3 volt component boards are designed to operate only in a 3.3 volt signaling environment. Incompatibility issues result when attempting to evolve exiting 5 volt systems into modern 3.3 volt signaling environments.

Figure 1:
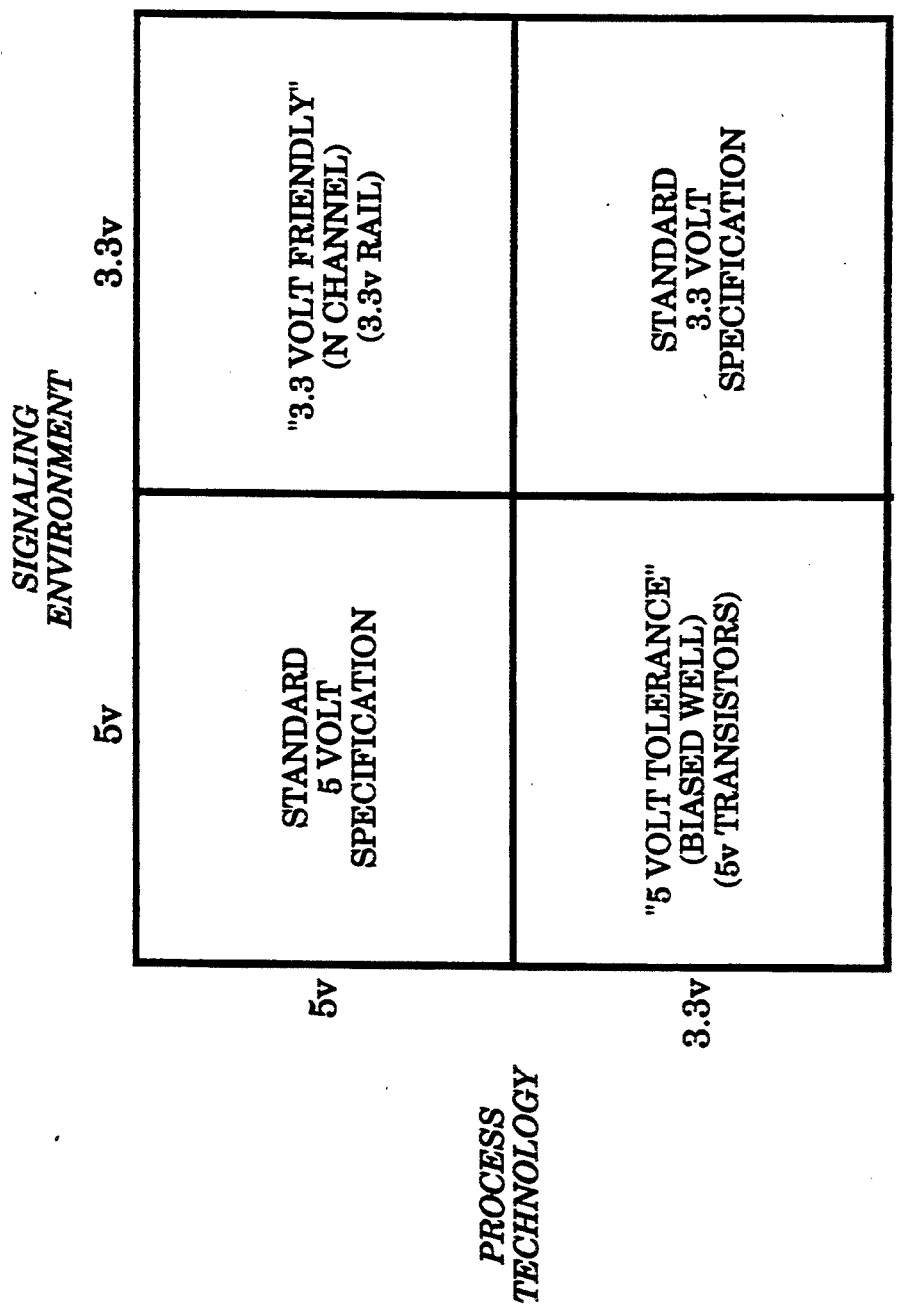
FIG. 1 is a chart illustrating the signaling environments of 5 and 3.3 volts ($V_{cc}$) versus 5 and 3.3 volt process technology.

Referring to FIG. 1, therein is illustrated a chart of process technology versus signaling environment. For purposes of this description, "signaling environment" is defined as the voltage by which an output driver will generate a digital signal along a bus. For example, in a 5 volt signaling environment, the output drivers will drive the signaling voltage between 0 and 5 volts, where the digital signal will be "clamped". For a 3.3 volt signaling environment, the output drivers will drive from 0 to 3.3 volts, where the digital signal will be clamped. In a 5 volt signaling environment, it is possible to drive a signal from 0 to 3.3 volts without any significant difficulty, however, in a 3.3 volt signaling environment, a 5 volt signal cannot be driven without sinking a significant amount of current into the 3.3 volt clamp. Additionally, as illustrated in FIG. 1, process technology may be characterized as either 3.3 volt or 5 volt. For purposes of this description, process technology is defined as semiconductor process technology designed for operation with either 3.3 or 5 volt $V_{cc}$. As illustrated in FIG. 1, the existing standard 5 volt specification utilizes 5 volt signaling technology and 5 volt process technology. Similarly, modern 3.3 volt process technology operates optimally in a 3.3 volt signaling environment.

As shown in FIG. 1, it is possible to utilize 3.3 volt process technology in a 5 volt signaling environment, however, additional circuitry is required within the 3.3 volt semiconductor device to withstand the 5 volt $V_{cc}$ voltage. In order for 3.3 volt process technology to be compatible with a 5 volt signal environment, each of the pins associated with the semiconductor device operating in the 5 volt environment must include additional circuitry to withstand the $V_{cc}$ voltage of 5 volts. The addition of this circuitry may result in the semiconductor component costing more than standard 5 volt process technology operating in a 5 volt signaling environment. When operating in a 5 volt signaling environment using 5 volt process technology, the 5 volt signals may be clamped in a straightforward manner. However, when attempting to operate 3.3 volt process technology in a 5 volt signaling environment, existing systems do not have clamping mechanisms to clamp the voltage at 3.3 volts for the 3.3 volt device. As a result, issues related to signal settling, signal reflection, ringing and other problems are presented by utilizing 3.3 volt process technology in a 5 volt signal environment.

Continuing to refer to FIG. 1, the case in which 5 volt and 3.3 volt process technology may be utilized in a 3.3 volt signaling environment is illustrated and identified as "3.3 volt friendly". It will be appreciated that the use of a 3.3 volt signaling environment using 3.3 volt process technology is straightforward and presents no technical issues, since the process technology is designed to work in the 3.3 volt signal environment. However, in the case of operating 5 volt process technology in a 3.3 volt signal environment, some additional circuitry may be required. The additional circuitry required to permit 5 volt process technology to operate in the 3.3 volt signaling environment has not been found to be prohibitive, and is significantly less expensive than circuitry required to permit a 3.3 volt process technology to operate in a 5 volt signal environment.

As will be described herein, the present invention provides a mechanism which allows an add-in board to be used in either a 5 volt or a 3.3 volt signaling environment so that a gradual transition from a 5 volt to a 3.3 volt signaling environment can be accomplished. Additionally, the present invention is compatible with the industry trend for evolving process technology from 5 volt to 3.3 volt, such that in the future, only 3.3 volt process technology will be used.

Figure 4:
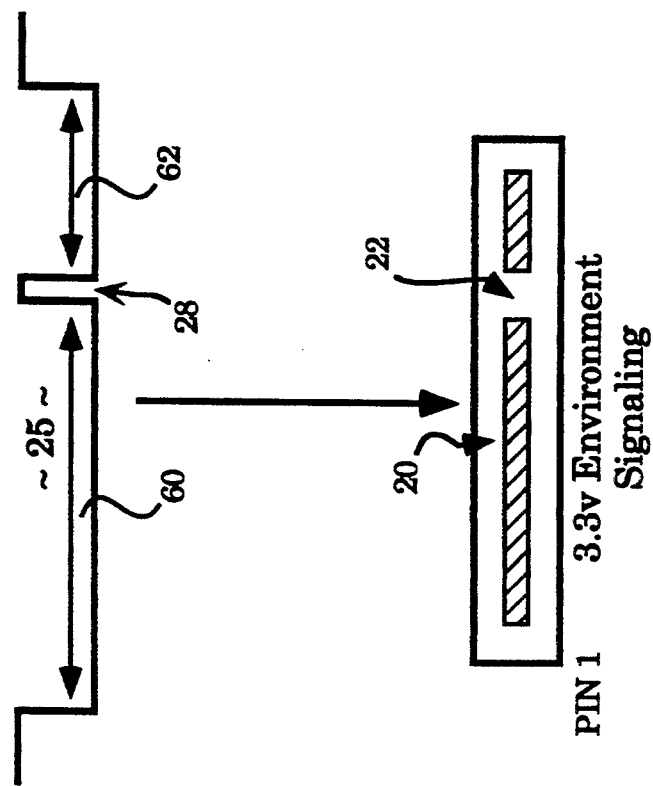
FIG. 4 illustrates a 3.3 volt $V_{cc}$ signaling environment board.
Figure 3:
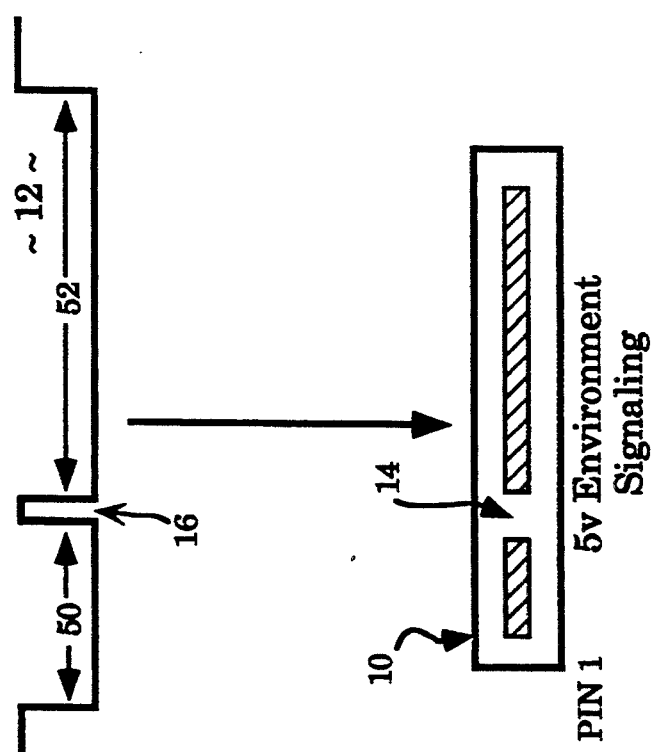
FIG. 3 illustrates a 5 volt $V_{cc}$ signaling environment board.

Now referring to FIGS. 3 and 4, two system environments are defined, each of the environments having the characteristic that they have a connector in the bus baseboard which accepts an add-in board. The first system environment (illustrated in FIG. 3) is a 5 volt environment. A 3.3 volt system environment (illustrated in FIG. 4) is also disclosed. The 5 volt signaling environment illustrated in FIG. 3 corresponds to the 5 volt signaling environment previously described with respect to FIG. 1 for both 3.3 volt and 5 volt process technology. Similarly, the 3.3 volt signaling environment illustrated in FIG. 4 corresponds to the 3.3 volt signaling environment illustrated in FIG. 1 for both 3.3 volt and 5 volt process technology.

Figure 2:
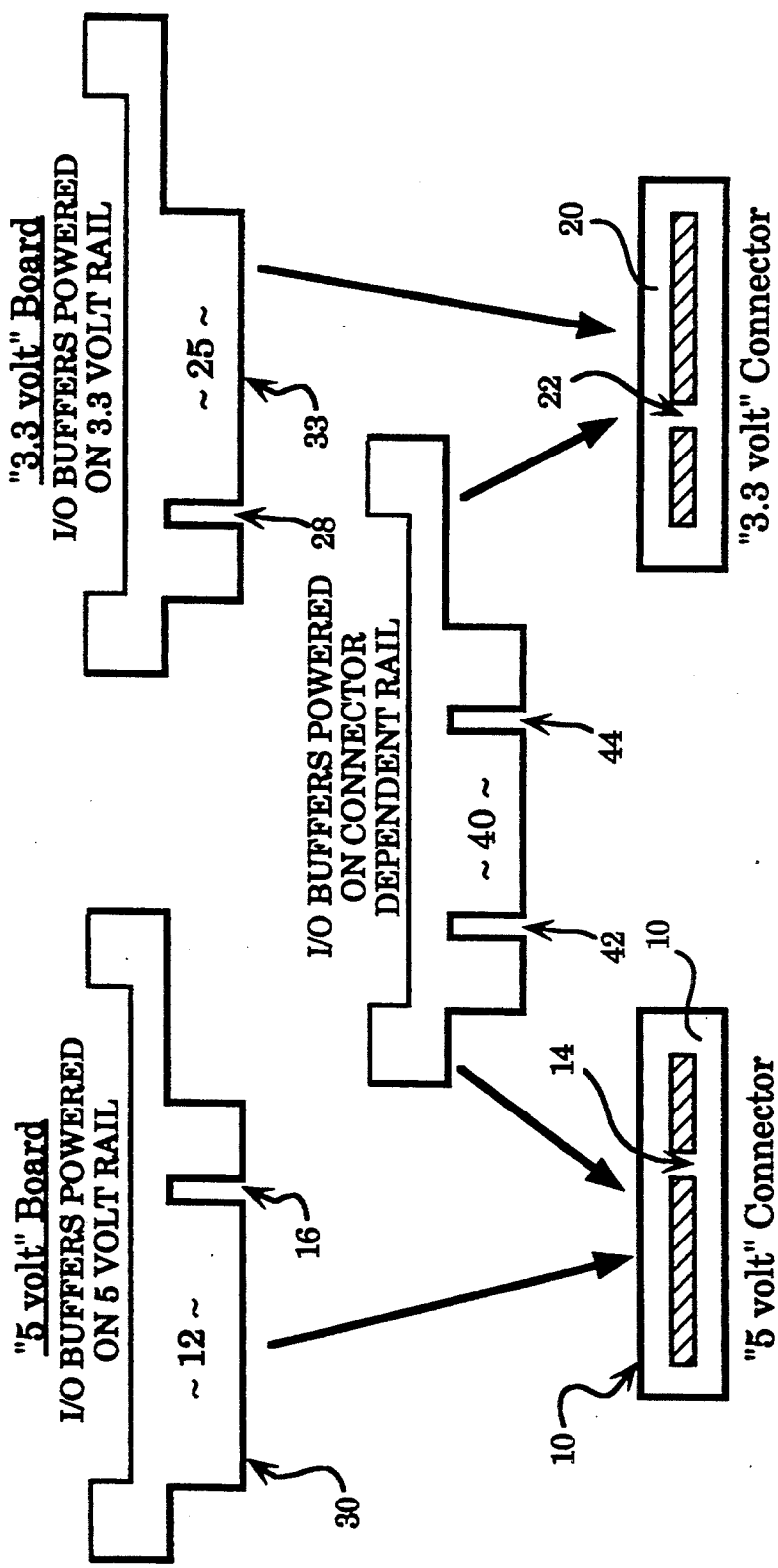
FIG. 2 illustrates the present invention's connector keying system for circuit boards including a 5 volt board, a 3.3 volt board and a dual voltage signaling board.

Referring briefly to FIGS. 2 and 3, a series of connectors are provided coupled to the bus structure of the present invention for receiving circuit boards. A 5 volt connector 10 is provided for receiving a 5 volt board 12. As illustrated in FIGS. 2 and 3, the 5 volt connector 10 includes a key 14. The key 14 is disposed to receive a cutout 16 on board 12. In operation, the key 14 may be disposed at any location along the connector 10. Similarly, the cutout 16 will be provided in the board 12, at a location dependent on the location of the key 14 in the connector 10.

As shown in FIG. 4, the 3.3 volt environment is characterized by a connector 20 having a key 22. The connector 20 is designed to receive a printed circuit board card 25 having a cutout 28 to receive the key 22. As in the case of the connector 10 and the board 12, the key 22 may be disposed at any location along the connector 20, and the cutout 28 will be at a location dependent on the location of the key 22 in the connector 20. As will be appreciated from a review of the figures, the use of a key to receive a cutout portion of the printed circuit board prohibits a user from inadvertently plugging an incompatible board into the respective connectors. For example, as shown in FIG. 2, it is not possible to insert board 25 into the connector 10, shown in FIG. 2, since the key 14 would not match the cutout 28 of the board 25. Similarly, it is not possible to insert board 12 into connector 20 since the key 22 will not register with the cutout 16 of the board 12.

Not shown, for purposes of clarity, are the electrical metal contacts disposed along the lower edge 30 of board 12, and edge 33 of board 25. Additionally, the pins disposed within the connectors 10 and 20 are not shown for receiving and electrically coupling to the metal contacts along edges 30 and 33, respectively. The boards 12 and 25 are contemplated to be standard card edge connectors used in the industry. One should note that other types of connectors may be attached to the edges of board 12 and board 25.

Referring now to FIG. 2, a dual voltage signaling board 40 includes a cutout 42 and a cutout 44, as shown. As illustrated in FIG. 2, dual voltage signaling board 40 may be inserted into 5 volt connector 10 such that cutout 44 registers with and accepts the key 14. Similarly, board 40 may also be inserted in the 3.3 volt connector 20 since the cutout 42 will register with key 22. Accordingly, it will be appreciated that it is possible to insert board 40 into either the 5 volt connector 10 or the 3.3 volt connector 20.

In the presently preferred embodiment, connector 10 includes both 5 volt as well as 3.3 volt $V_{cc}$ pins and I/O power pins being connected to 5 volts. In FIG. 3, predefined metal contacts for 5 volt and 3.3 volt $V_{cc}$ may be provided at any locations in the areas 50 and 52 of board 12. Pins for 5 volt and 3.3 volt $V_{cc}$ are provided in the connector 10, at locations dependent on the corresponding locations of the 5 volt and 3.3 volt $V_{cc}$ on the board 12. The board 12 also has predetermined I/O power metal contacts at any locations in the areas 50 and 52 of board 12 to mate with the corresponding I/O power pins in the connector 10 to define the signaling environment of the board. Since the I/O power pins in the connector 10 are connected to 5 volts, the board 12 operates in a 5 volt signaling environment. Accordingly, referring now to FIG. 1, the system illustrated in FIG. 3 would operate in the 5 volt signaling environment for both 3.3 volt and 5 volt process technology. It will be noted by the reader that the actual location of the predefined 5 volt and 3.3 volt $V_{cc}$ metal contacts and the I/O power metal contacts along the edge of the board 12 is a matter of design choice.

Referring now to FIG. 4, board 25 includes areas 60 and 62 which provide predetermined I/O power metal contacts and dedicated metal contacts having $V_{cc}$ equal to 5 volts and 3.3 volts. The connector 20 has 5 volt and 3.3 volt $V_{cc}$ pins and I/O power pins connected to 3.3 volts to mate with the corresponding 5 volt and 3.3 volt $V_{cc}$ metal contacts and I/O power metal contacts in the board 25. Since the I/O power pins in the connector 20 are connected to 3.3 volts, the board 25 operates in a 3.3 volt signaling environment when the board 25 is electrically connected to the connector 20. Accordingly, the card arrangement illustrated in FIG. 4 corresponds to the 3.3 volt signaling environment in which both 5 volt and 3.3 volt process technology may be utilized, as shown in FIG. 1. As in the case of the system illustrated in FIG. 3, the actual location of the predefined 5 volt and 3.3 volt $V_{cc}$ metal contacts and the I/O power metal contacts along the board 25 is a matter of design choice.

Figure 5:
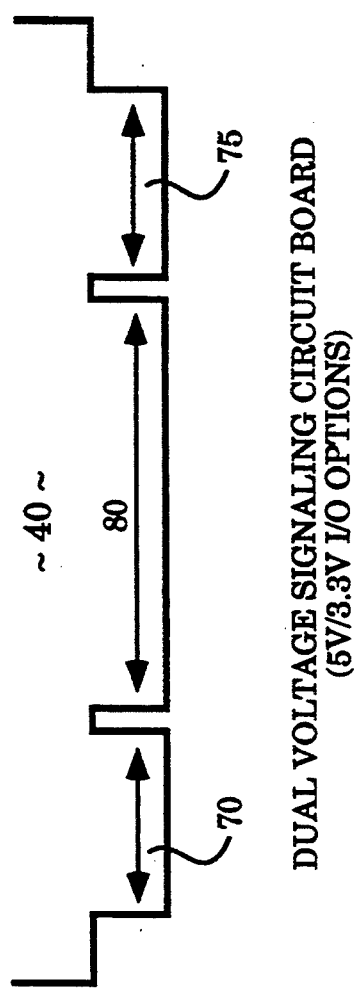
FIG. 5 illustrates the present invention's universal board for both 5 volt and 3.3 volt $V_{cc}$ components.

Referring now to FIG. 5, the dual voltage signaling circuit board 40 of the present invention is shown. The dual voltage signaling board 40 includes I/O power metal contacts and metal contacts for 5 volt and 3.3 volt $V_{cc}$. These metal contacts may be placed at any locations in areas 70, 75 and 80 along the edge of the board 40. As previously described, circuit board 40 may be inserted into either connector 10 or connector 20. The I/O power pins in either connector 10 or 20 when coupled to the I/O power metal contacts on the board 40 define the signaling environment of the board 40 and power the I/O buffers on the board 40. The voltage (V) to the I/O buffers on the board 40 may be compatible with either the 5 volt or 3.3 volt signaling environment. Optimally, the I/O buffers are comprised of dual voltage buffers capable of operating from either the 5 volt or the 3.3 volt power rail. The I/O buffers are powered from the I/O power metal contacts that are coupled to the I/O power pins in either connector 10 or connector 20. Accordingly, in the 5 volt signaling environment provided by connector 10, the buffers are powered on the 5 volt $V_{cc}$ rail. If circuit board 40 is inserted into 3.3 volt connector 20, the I/O buffers are powered on the 3.3 volt rail. This enables the universal dual voltage signaling circuit board 40 to be compatible with either signaling environment.

While the present invention has been described in conjunction with a few specific embodiments identified in FIGS. 1 through 5, it will be apparent to those skilled in the art that many alternatives, modifications and variations in light of the foregoing description are possible. Accordingly, the invention is intended to embrace all such alternatives, modifications and variations as may fall within the spirit and scope of the invention as disclosed.

I claim:

1. A bus system comprising:
a first connector for providing a first voltage signaling environment, said first connector including first key means for receiving a first circuit board, said first circuit board having first mating key means for accepting said first key means thereby permitting said first circuit board to be electrically coupled to said first connector;
a second connector for providing a second voltage signaling environment, said second connector including second key means for receiving a second circuit board, said second circuit board having second mating key means for accepting said second key means thereby permitting said second circuit board to be electrically coupled to said second connector; and
a third circuit board, said third circuit board having said first mating key means and said second mating key means for accepting said first and second key means thereby permitting said third circuit board to be electrically coupled to either of said first and said second connectors.

2. The bus system as defined by claim 1 wherein said first connector includes at least one predetermined voltage signaling pin, said second connector includes at least one predetermined voltage signaling pin, said first circuit board includes at least one predetermined mating voltage signaling metal contact, said second circuit board includes at least one predetermined mating voltage signaling metal contact, and said third circuit board includes at least one predetermined mating voltage signaling metal contact whereby
said first voltage signaling pin is coupled to a first voltage thereby defining said first voltage signaling environment; and
said second voltage signaling pin is coupled to a second voltage thereby defining said second voltage signaling environment.

3. The bus system as defined by claim 2 wherein
said first voltage signaling pin provides said first voltage signaling environment to said first circuit board when said first mating voltage signaling metal contact is coupled to said first voltage signaling pin;
said second voltage signaling pin provides said second voltage signaling environment to said second circuit board when said second mating voltage signaling metal contact is coupled to said second voltage signaling pin;
said first voltage signaling pin provides said first voltage signaling environment to said third circuit board when said third mating voltage signaling metal contact is coupled to said first voltage signaling pin; and
said second voltage signaling pin provides said second voltage signaling environment to said third circuit board when said third mating voltage signaling metal contact is coupled to said second voltage signaling pin.

4. The bus system as defined by claim 3 wherein said first circuit board includes at least one input and one output buffer, said second circuit board includes at least one input and one output buffer, and said third circuit board includes at least one input and one output buffer whereby
said input and output buffers of said first circuit board are powered by said first voltage signaling pin when said first voltage signaling pin is coupled to said first mating voltage signaling metal contact;
said input and output buffers of said second circuit board are powered by said second voltage signaling pin when said second voltage signaling pin is coupled to said second mating voltage signaling metal contact;
said input and output buffers of said third circuit board are powered by said first voltage signaling pin when said first voltage signaling pin is coupled to said third mating voltage signaling metal contact; and said input and output buffers of said third circuit board are powered by said second voltage signaling pin when said second voltage signaling pin is coupled to said third mating voltage signaling metal contact.

5. The bus system as defined by claim 2 wherein said first connector provides a 5 volt $V_{cc}$ signaling environment and said second connector provides a 3.3 volt $V_{cc}$ signaling environment.

6. The bus system as defined by claim 2 wherein said voltage signaling pin comprises of a $V_{I/O}$ pin.

7. The bus system as defined by claim 1 wherein a portion of said first circuit board, including said first mating key means, is inserted into said first connector, and a portion of said second circuit board, including said second mating key means, is inserted into said second connector.

8. The bus system as defined by claim 7 wherein a portion of said third circuit board, including said first mating key means and said second mating key means, is inserted into either of said first and said second connectors.

9. The bus system as defined by claim 8 wherein said first key means comprises a physical barrier in said first connector which receives said first mating key means comprising a cutout.

10. The bus system as defined by claim 9 wherein said second key means comprises a physical barrier in said second connector which receives said second mating key means comprising a cutout.

11. An electrical connecting apparatus comprising:
a connector with (i) an I/O voltage pin coupled to receive a bus voltage of only one of a first voltage and a second voltage to provide a voltage signaling environment, (ii) a first $V_{cc}$ pin coupled to receive said first voltage providing a first power supply voltage for a circuit board, (iii) a second $V_{cc}$ pin coupled to receive said second voltage providing a second power supply voltage for said circuit board, and (iv) a key means for predetermined selective engagement of the connector as a function of said bus voltage; and said circuit board including (i) an input/output buffer, said buffer designed for operation with a buffer power supply of either one of said first voltage and said second voltage, (ii) an I/O voltage first contact for cooperative engagement of said i/o voltage pin, said first contact coupling said buffer power supply to said bus voltage, (iii) a second contact for cooperatively engaging at least one of said first $V_{cc}$ pin and said second $V_{cc}$ pin, and (iv) key mating means for cooperative engagement of said key means of said connector.

* * * * *

UNITED STATES PATENT AND TRADEMARK OFFICE
CERTIFICATE OF CORRECTION

PATENT NO.    : 5,421,734
DATED         : June 6, 1995
INVENTOR(S)   : Peter MacWilliams It is certified that error appears in the above-identified patent and that said Letters Patent is hereby corrected as shown below:

In column 8 at line 21 delete "i/O" and insert --I/O--

Signed and Sealed this

Fourth Day of March, 1997

Attest:

BRUCE LEHMAN

Attesting Officer

Commissioner of Patents and Trademarks